United States Patent
Hayashi

(10) Patent No.: US 6,359,235 B1
(45) Date of Patent: Mar. 19, 2002

(54) ELECTRICAL DEVICE MOUNTING WIRING BOARD AND METHOD OF PRODUCING THE SAME

(75) Inventor: Katsura Hayashi, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/627,846

(22) Filed: Jul. 28, 2000

(30) Foreign Application Priority Data

Jul. 30, 1999 (JP) .......................... 11-218056

(51) Int. Cl.[7] .............. H05K 1/16; H05K 1/11
(52) U.S. Cl. ............ 174/260; 174/255; 174/256; 174/258; 174/262; 361/760; 361/761; 361/762; 361/763; 361/764; 257/737; 257/778
(58) Field of Search ................... 174/260, 255, 174/256, 258, 257, 261, 262, 264, 259; 361/760, 792, 793, 794, 795, 739, 746, 761, 762, 763, 764, 765, 783, 803, 812; 257/778, 787, 737, 713

(56) References Cited

U.S. PATENT DOCUMENTS

| | | | | |
|---|---|---|---|---|
| 5,780,776 A | * | 7/1998 | Noda | 174/255 |
| 5,814,883 A | * | 9/1998 | Sawai et al. | 257/712 |
| 5,901,050 A | * | 5/1999 | Imai | 361/820 |
| 6,015,722 A | * | 1/2000 | Banks et al. | 438/108 |
| 6,025,648 A | * | 2/2000 | Takahashi et al. | 257/778 |
| 6,183,592 B1 | * | 2/2001 | Sylvester | 156/299 |
| 6,222,265 B1 | * | 4/2001 | Akram et al. | 257/723 |
| 6,248,959 B1 | * | 6/2001 | Sylvester | 174/256 |
| 6,265,772 B1 | * | 7/2001 | Yoshida | 257/712 |

FOREIGN PATENT DOCUMENTS

| | | |
|---|---|---|
| JP | 8-88471 | 4/1996 |
| JP | 9-046049 | 2/1997 |
| JP | 9-186204 | 7/1997 |
| JP | 9-283697 | 10/1997 |
| JP | 9-321408 | 12/1997 |
| JP | 11-040745 | 2/1999 |

* cited by examiner

Primary Examiner—Jeffrey Gaffin
Assistant Examiner—I. B. Patel
(74) Attorney, Agent, or Firm—Hogan & Hartson, L.L.P.

(57) ABSTRACT

An electronic device mounting wiring board having an electronic device mounted on the surface of a wiring substrate or inside thereof is provided. The wiring substrate includes an insulation substrate made by laminating a plurality of insulation layers that include a thermosetting resin, a wiring circuit layer formed on the surface of and inside of the insulation substrate and via hole conductors. A resin layer having a glass transition temperature lower than the curing temperature of the thermosetting resin is formed between at least one of top and bottom surfaces of the electrical device and the insulation layer.

10 Claims, 5 Drawing Sheets

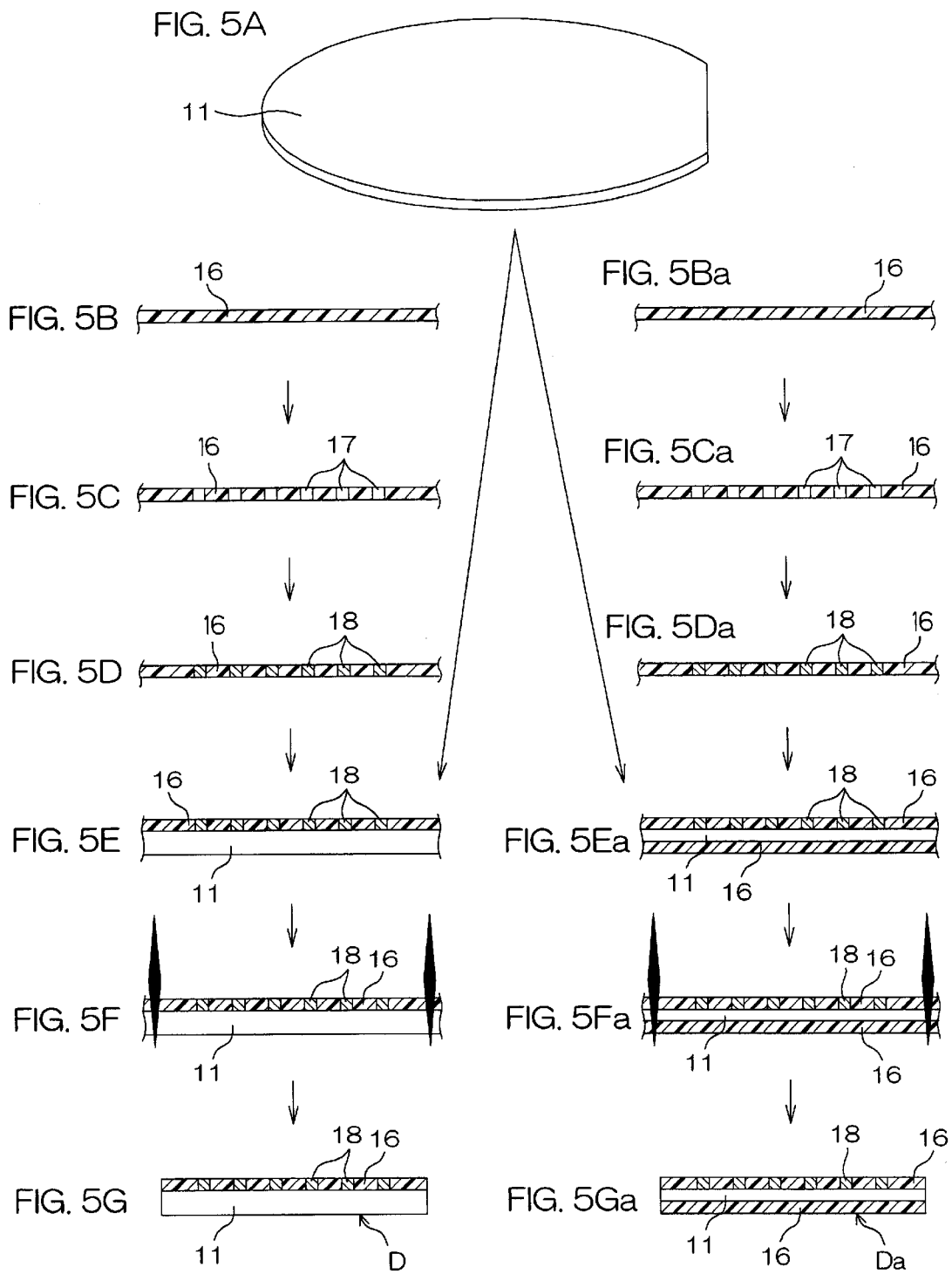

ELECTRICAL DEVICE MOUNTING WIRING BOARD AND METHOD OF PRODUCING THE SAME

BACKGROUND OF THE INVENTION

1. Field of the Invention

The present invention relates to an electrical device mounting wiring board comprising an insulation substrate with electrical devices such as capacitor and semiconductor device mounted on the surface or inside thereof, and a method of producing the same.

2. Description of Related Art

Recently electronics apparatuses have been becoming more compact, and the so-called mobile computing is becoming popular in which people carry hand-held information terminals or computers and operate them away from their homes or offices. To build such compact electronics apparatuses, demands have been growing for a multi-layer wiring board of compact and thin construction with fine patterning.

Semiconductor devices are mounted on the multi-layer wiring board by mounting a package having the semiconductor devices hermetically sealed therein on the multi-layer wiring board. However, this mounting method requires the step of electrically connecting the package with an electrical circuit layer provided on the surface of the multi-layer wiring board. As a result, the production process for completing an electrical apparatus that includes the semiconductor devices includes many steps, leading to a high production cost. Moreover, since the semiconductor devices can be mounted only on the surface of the multi-layer wiring board, there has been a limitation to the size and thickness reduction of the electrical apparatus and to the increase in the packaging density of the semiconductor devices.

Connection between the package and the wiring layer is made, for example, by wire bonding. In this case, connection pads provided on the wiring layer must be arranged at intervals of about 200 $\mu$m. This requirement also hampers the progress of size reduction. Also because terminals of the package must be individually connected to the connection pads, it takes a long time to make connection resulting in low productivity. Furthermore, since the bonding wire connects the package terminal and the connection pad while winding in a loop shape, a clearance of about 0.5 mm must be secured in the direction of thickness of the package. This has also been hampering the progress of size and thickness reduction of the electrical apparatuses.

In order to solve these problems, module construction where a plurality of semiconductor devices are stacked is proposed in, for example, Japanese Unexamined Patent Publication (KOKAI) No. 9-186204 (1997), Japanese Unexamined Patent Publication (KOKAI) No. 9-283697 (1997) and Japanese Unexamined Patent Publication (KOKAI) No. 11-40745 (1999).

This construction makes it possible to reduce the total area of the wiring board. At the same time, however, there is a problem of increasing thickness of the electrical apparatus including the semiconductor devices as a whole. Moreover, a complex step is involved for connecting the stacked devices, thus resulting in an increasing production cost.

With the background described above, such attempts have been made as incorporating semiconductor devices in the wiring board itself. These attempts are roughly divided into techniques that are based on the conventional printed wiring board, and techniques that are based on the build-up wiring board.

The techniques based on the printed wiring board is disclosed, for example, in Japanese Unexamined Patent Publication (KOKAI) No. 8-88471 (1996). With the technique disclosed in this publication, a printed wiring board is made with part thereof being machined to form recesses. Semiconductor devices are housed in the recesses and electrically connected to wiring lines, via wires provided in the wiring board. Then another wiring board is laminated on the wiring board by thermal pressing or the like, thereby forming a multi-layer wiring board.

The techniques based on the build-up wiring board is disclosed, for example, in Japanese Unexamined Patent Publication (KOKAI) No. 9-321408 (1997) and Japanese Unexamined Patent Publication (KOKAI) No. 9-46049 (1997). With the technique disclosed in these publications, a printed wiring board is made with part thereof being machined to form recesses. Semiconductor devices are housed in the recesses and a circuit is formed thereon by build-up technique. Thus the semiconductor devices are incorporated in the wiring board.

However, any of these techniques have a problem in the applicability to mass production. With the technique based on the printed wiring board, the semiconductor device may be subjected to breakage during the thermal pressing step. This is because one of the boards being thermally pressed has already been cured and therefore even slight unevenness in the recesses that have been machined leads to stress concentration in the uneven portions. Also because shrinkage of the resin used for making the board due to curing proceeds differently on the front and back sides of the semiconductor device, there has been a problem of the semiconductor devices to break due also to the stress concentration caused by shrinkage during curing.

With the technique based on the build-up wiring board, on the other hand, stresses described above are less likely to be generated and lead to less occurrence of breakage of the semiconductor devices. However, there are other problems caused by the step of forming the wiring pattern, that is a wet process such as plating, and by the intrinsically highly moisture-absorption property of a photosensitive resin that is used in the build-up wiring board. Specifically, it has been difficult to put the build-up wiring board into commercial operation, because of insufficient heat resistance (causing swell and other defects generated during solder reflow) due to the absorption of moisture, and significant decrease in reliability demonstrated in thermal cycle test and pressure cooker test.

For the build-up wiring board, much attention has been paid to the laser via board wherein via holes are made by means of carbon dioxide gas laser. However, when it is attempted to incorporate the semiconductor devices in the laser via board, there may occur such a problem as the circuit over the semiconductor devices is broken by the heat generated by the laser when forming the via holes. Also because silicon used in the substrate of the semiconductor device has high heat conductivity, heat of laser is absorbed by the silicon substrate. Consequently, residue of resin, called the smear, deposit on the silicon substrate after machining with the laser. The resin residue hampers electrical connection. As a result, it has been also difficult to put the technique based on the laser via board into commercial operation Problems similar to the above arise also in cases where electrical components other than semiconductor devices such as capacitor and resistor are mounted on the multi-layer wiring board.

SUMMARY OF THE INVENTION

First object of the present invention is to provide an electrical device mounting wiring board with electrical devices incorporated therein, thereby making it possible to decrease the size of electrical apparatuses and to increase the packaging density of component devices.

Second object of the present invention is to provide a method of producing the electrical device mounting wiring board that makes it possible to easily produce a wiring board having electrical devices incorporated inside thereof.

The present inventors have studied intensively to reduce the size of a wiring board incorporating electrical devices and to simplify a method of producing the same. As a result, it has been found that stress concentration on the electrical devices when the electrical devices are incorporated in the wiring board can be mitigated by forming a resin layer having a glass transition point lower than the curing temperature of a thermosetting resin in the wiring board which incorporates the electrical devices, between at least one of top and bottom surfaces of the electrical device and an insulation layer constituting the wiring board, thereby making it possible to drastically improve the productivity of the step of incorporating the electrical devices.

It has also been found that stress concentration can be mitigated further by arranging electrical device on or in an insulation sheet that includes a thermosetting resin that has not yet cured, and incorporating the electrical device simultaneously as the insulation sheet cures.

The electrical device is typically a semiconductor device with electrodes arranged in a matrix on one principal surface thereof.

The substrate of a semiconductor device is made of a very brittle substance such as single crystal silicon. Therefore, when incorporating semiconductor devices in a multi-layer wiring board that includes thermosetting resin in the insulation substrate thereof, it is preferable to fasten the semiconductor devices by insulation layers placed over and below thereof. In case there is a very large difference in the thermal expansion coefficient between the insulation layer of the wiring board containing an organic resin and the semiconductor device, there has been a high possibility of the semiconductor devices to break due to the stress generated when the wiring board is heated to cure and the stress generated by a pressure applied for bonding the layers.

According to the present invention, the insulation substrate is maintained in a soft state until the temperature is raised from the room temperature to the curing start temperature, in order to incorporate the electrical device in the insulation substrate that is not yet cured or in the B stage. As a consequence, the electrical device is not subject to stress concentration and integrity of the devices is maintained.

At the time when the thermosetting resin included in the insulation substrate is cured, glass transition point Tg of the resin layer bonded to one or both sides of the electrical device is lower than the thermal curing temperature. As a result, since the resin layer softens at the thermal curing temperature, the electrical device is always enclosed by a soft material during the period from the start to the end of curing of the multi-layer wiring board. Thus integrity of the electrical device is maintained. As a consequence, it is made possible to relieve the electronic device from additional stress since the softened resin layer absorbs the stress that is generated by the shrinkage of the insulation substrate during curing.

Owing to the effects described above, the electrical device can be incorporated in the multi-layer wiring board with a high yield of production. Since the electrical device can be incorporated in the wiring board as well as being mounted on the wiring board, it is made possible to reduce the size of the electrical apparatus further.

Meanwhile, the present inventors have reached such a finding as follows. That is, when electrodes of the electrical device are connected to via hole conductors or the connection pads in the wiring layer, and a low-melting point metal, of which melting point is lower than the curing temperature of the thermosetting resin included in the insulation substrate, is included in the via hole conductors or the connection pads, it is made possible to carry out the electrical connection between the electrical of the electrical device and the via hole conductors and the fabrication of the wiring board at the same time, and the electrical device can be easily incorporated in the multi-layer wiring board.

The above objects as well as other objects, features and effects of the present invention will become apparent from the description of preferred embodiments with reference to the accompanying drawings.

BRIEF DESCRIPTION OF THE DRAWINGS

FIGS. 5A to 5G and FIGS. 5B$a$ to 5G$a$ are sectional views for explaining another method of producing semiconductor devices to be incorporated in the wiring board.

DESCRIPTION OF THE PREFERRED EMBODIMENTS

FIG. 1A to FIG. 1E are sectional views showing a method of producing a single-layer wiring sheet that constitutes a multi-layer wiring board according to an embodiment of the present invention.

Figure 1A:
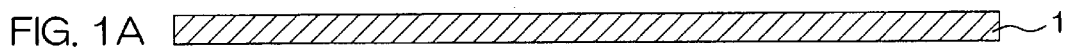
FIG. 1A to FIG. 1E are sectional views showing a method of producing a single-layer wiring sheet that constitutes a multi-layer wiring board according to an embodiment of the present invention.

First, as shown in FIG. 1A, an insulation sheet 1 that has not yet cured is prepared. The insulation sheet 1 is made of an insulating material (namely, dielectric material) that includes a thermosetting resin. There is no limitation to the material of the insulation sheet 1 as long as the thermosetting resin has satisfactory electrical properties and heat resistance required for the insulation material (dielectric material) and sufficient mechanical strength. For example, aramid resin, phenolic resin, epoxy resin, imide resin, fluorocarbon resin, phenylene-ether resin, bismaleimide triazine resin, urea resin, melamine resin, silicone resin, urethane resin, unsaturated polyester resin and allyl resin may be used alone or in combination.

The insulation sheet 1 may be made of a composite material consisting of an organic resin and a filler, in order to increase the mechanical strength of the insulation substrate or the wiring board as a whole. As the filler composed with the organic resin, an inorganic filler such as $SiO_2$, $Al_2O_3$, $ZrO_2$, $TiO_2$, AlN, SiC, $BaTiO_3$, $SrTiO_3$, zeolite, $CaTiO_3$, or aluminumborate may be used. Alternatively, glass or aramid resin may be used in the form of a nonwoven or woven fabric that is impregnated with the resin described above. Organic resin and filler are opportunely included in the composite material in volume proportion in a range from 15:85 to 95:5 (preferably in range from 25:75 to 95:5, more preferably in range from 25:75 to 50:50).

As the insulation sheet 1, a prepreg in the form of a nonwoven or woven fabric that is impregnated with resin is preferably used. A prepreg made by impregnating a glass fiber cloth with a thermosetting polyphenylene-ether resin is advantageously used because of less generation of resin dust.

Figure 1B:
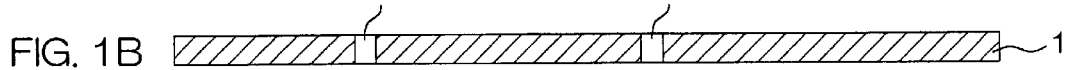

The via holes 2 are formed in the insulation sheet 1 as shown in FIG. 1B. Known methods such as punching or laser machining by means of carbon dioxide laser, YAG laser, excimer laser or the like may be employed for forming the via holes 2 in the insulation sheet 1. Besides these processes, drilling or sand blast may also be employed.

Figure 1C:
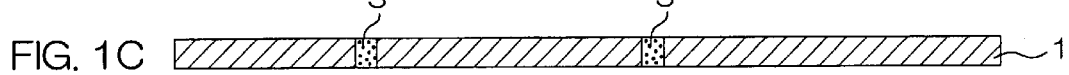

The via holes 2 are filled with an electrically conductive paste thereby to form via hole conductors 3 as shown in FIG. 1C. The electrically conductive paste that fills the via holes 2 includes a metal such as tin (Sn), zinc (Zn), bismuth (Bi), silver (Ag) or copper (Cu), or an alloy of these metals.

Then a transfer film 5 having a wiring layer 4 formed on the surface thereof is contact-bonded on the insulation sheet 1 with pressure, thereby transferring the wiring layer 4 onto the surface of the insulation sheet 1. The wiring layer 4 is preferably formed from at least one kind of metal selected from among a group consisting of copper, aluminum, gold and silver, or an alloy of two or more metals selected therefrom. Particularly copper or an alloy that includes copper is most preferable. In order to control the resistance of the circuit, a metal of high resistivity such as Ni—Cr alloy may also be mixed as a component of the conductor or alloyed therewith, as required. The wiring layer 4 preferably comprises a metal foil. Further, in order to decrease the resistance of the wiring layer, the metal component of the conductor may include 2 to 20% by weight of a metal that has a melting point lower than that of the low-resistivity metal described above, for example, a low-melting point metal such as solder or tin.

A single-layer wiring sheet A1 can be made as described above. It is important in this stage to have the insulation sheet 1 not to cure completely. Although the insulation sheet may be heated to cure when transferring the wiring layer 4, it is important that the insulation sheet 1 is not yet cured or remains in the B stage, and maintains softness at the room temperature. If not soft, stress concentration may occur when the semiconductor devices are incorporated therein due to a pressure applied during the final curing of the wiring board, resulting in breakage of the devices in many cases.

Figure 2A:
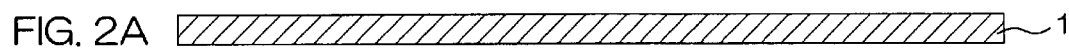
FIGS. 2A to 2D are sectional views showing a method of producing a wiring sheet for mounting electrical device thereon.
Figure 2B:
Figure 2C:

In the meantime, the insulation sheet 1 similar to that shown in FIG. 1A is prepared and a wiring sheet A2 for mounting a semiconductor device thereon, as an example of the electrical device, are produced as shown in FIG. 2A to 2D. Although the method of fabrication is similar to that of the insulation sheet 1, via holes 2a for the connection of electrical device and general via holes 2b for other than the connection of electrical device are formed in the insulation sheet 1 as shown in FIG. 2B. Then as shown in FIG. 2C, the via holes 2a are filled with a conductive paste including a low-melting point metal that has a melting point not higher than the curing temperature T1 of the thermosetting resin that constitutes the insulation sheet 1, thereby forming via hole conductors 3a for the connection of electrical device. Filling the via holes with the conductive paste is carried out by screen printing or sucking process. Formed in the general via holes 2b are ordinary via hole conductors 3b similar to the via hole conductors 3.

The melting point T2 of the low-melting point metal and the curing temperature T1 of the thermosetting resin preferably satisfy relations of the expression $T2 \leq T1$ and $T1-T2 \geq 10°$ C. When the difference T1-T2 is greater than 10° C., the low-melting point metal included in the via hole conductors 3a is molten when curing the thermosetting resin, thereby strengthening the bonding with the electrical device.

The low-melting point metal may constitute the entire metal component included in the conductive paste, although it may lead to lower capability of the via hole conductor to maintain the shape when melted during the thermal curing operation to be described later. Therefore, it is preferable to use the low-melting point metal and a high-melting point metal, that has a melting point higher than the curing temperature of the thermosetting resin, in a mixture. For the high-melting point metal that has a melting point higher than the curing temperature of the thermosetting resin, copper, silver, copper-silver alloy or a mixture thereof may be used. The high-melting point metal and the low-melting point metal are preferably mixed in volume proportions in a range from 90:10 to 10:90.

The via hole conductors 3b that are not connected to the electrical device may not necessarily include the low-melting point metal. That is, it suffices to fill the via holes with a conventional conductive paste that includes a high-melting point metal powder such as copper, silver, or an alloy of metals including copper and/or silver, thereby forming the via hole conductors 3b.

The conductive paste that is to constitute the via hole conductors 3a may be prepared by using a metal powder comprising the low-melting point metal or a mixture of the low-melting point metal and the high-melting point metal. The metal powder preferably has mean particle size of 0.5 to 50 $\mu$m. When the mean particle size of the metal powder is smaller than 0.5 $\mu$m, contact resistance between particles of the metal powder increases, thus resulting in higher resistance of the via hole conductors. When the mean particle size of the metal powder is greater than 50 $\mu$m, it becomes difficult to decrease the resistance of the via hole conductors.

For the low-melting point metal included in the conductive paste that is to form the via hole conductors 3a, tin (Sn), zinc (Zn) or bismuth (Bi), or an alloy of these metals with silver (Ag) or copper (Cu) is preferably used.

The conductive paste may include an organic resin for binding and a solvent added and mixed to the metal powder described above. The solvent added to the paste may be anything that can dissolve the organic resin for binding to be used. Examples of such a solvent include isopropyl alcohol, terpineol, 2-octanol and butyl-carbitol acetate.

As the organic resin for binding included in the conductive paste, triallyl isocyanurate or cellulose may be used as well as the various organic resins described above that constitute the insulation layer. The organic resin binds the particles of the metal powder described above together and, at the same time, acts to bond the metal powder to the insulation sheet. The organic resin is preferably included in the metal paste in 0.1 to 40% by volume, particularly 0.3 to 30% by volume. This is because, when the resin content is less than 0.1% by volume, it becomes difficult to bind the metal powder particles strongly and bond the low-melting point metal strongly to the insulation layer. When the resin content is more than 40% by volume, on the other hand, it becomes difficult to bring the particles of the metal powder into sufficient contact with each other because of the resin intervening between the particles, thus increasing the resistance of the via hole conductors.

Figure 1D:
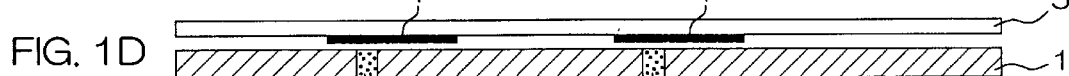
Figure 1E:
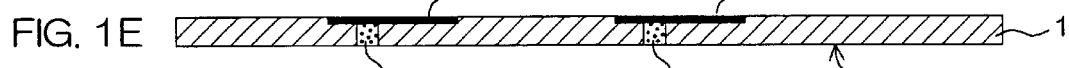
Figure 2D:
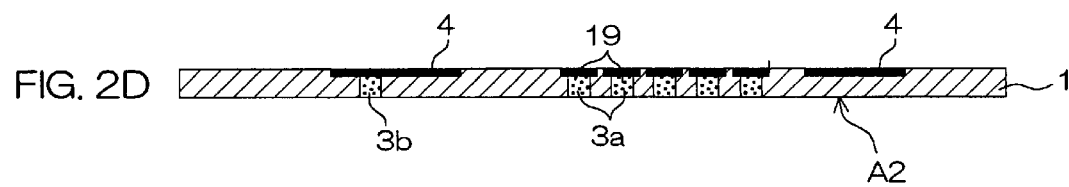

Then as shown in FIG. 2D, the wiring circuit layer 4 is formed on the front or back side of the insulation sheet 1 as required. The wiring circuit layer 4 may also be formed by, after adhering a metal foil on the surface of the insulation sheet 1, forming the circuit pattern by etching. The wiring circuit layer 4 may also be formed by plating after forming a resist layer on the surface of the insulation sheet 1. Most preferably, such a process may also be employed as a metal foil is adhered onto a transfer film and, after forming the circuit pattern by etching the metal foil, the circuit pattern comprising the metal foil is transferred onto the surface of the insulation sheet 1, as shown in FIGS. 1D and 1E. It is preferable that the wiring circuit layer 4 is not formed on the via hole conductors 3*a* to be connected to the electrodes of the electrical device, or connection pads that include the low-melting point metal described above are provided thereon. FIG. 2D shows an example where connection pads 19 are formed on the via hole conductors 3*a*.

Figure 3A:
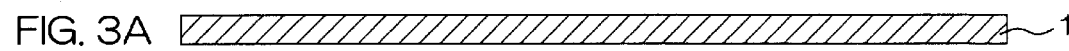
FIGS. 3A to 3D are sectional views showing a method of producing a wiring sheet having a cavity for incorporating electrical device therein.
Figure 3B:
Figure 3C:
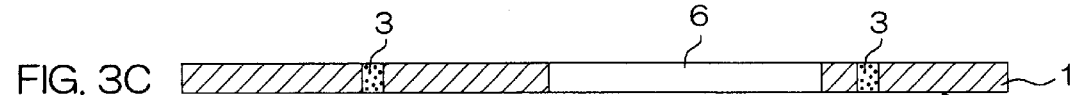
Figure 3D:

On the other hand, as shown in FIG. 3A, an insulation sheet 1 similar to that shown in FIG. 1A is prepared and a cavity 6 for housing the electrical device is made together with the via holes 2 by means of laser or other process. Carbon dioxide gas laser is preferably employed in this process similarly to the case described previously. The cavity 6 may also be formed by punching using a die. Then, conductive paste is filled in the via holes 2, thereby forming via hole conductors 3. In these processes, a single-layer of wiring sheet B is produced. In FIGS. 3C and 3D, two wiring sheets B1 and B2 are produced. Following the process shown in FIGS. 3C, 3D, the wiring circuit layer may also be formed similarly to the steps shown in FIGS. 1D, 1E after the step of FIGS. 3C, 3D.

Figure 4A:
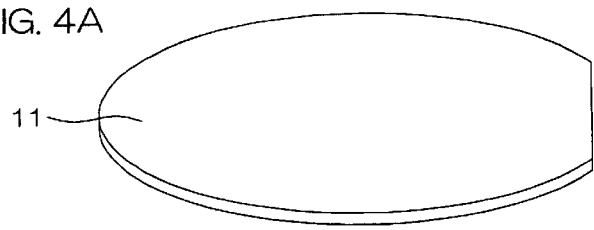
FIGS. 4A to 4H and FIGS. 4B$a$ to 4H$a$ are sectional views for explaining a method of producing a semiconductor device as an example of the electrical device to be incorporated in the wiring board.

Now the method of producing the semiconductor devices as the electrical device to be housed in the wiring board will be described below with reference to FIGS. 4A to 4H. First, as shown in FIG. 4A, a semiconductor wafer 11 with semiconductor circuit formed thereon is prepared.

Figure 4B:
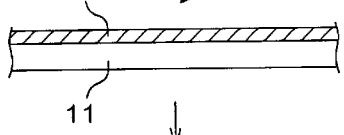
Figure 4C:
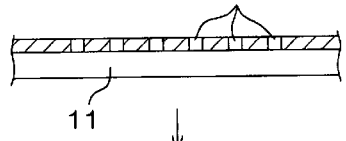
Figure 4D:
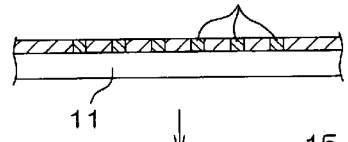

The wafer 11 is coated with a resist 12 made of a photosensitive resin as shown in FIG. 4B. This is followed by the formation of the holes 13 as shown in FIG. 4C by exposure to light and development. Then as shown in FIG. 4D, via posts 14 are formed by either filling the holes 13 with the conductive paste or precipitating a metal such as copper by partial plating or other means.

Figure 4E:
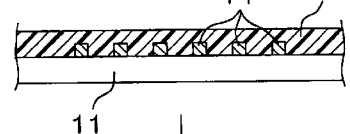

Then after peeling the resist 12 off the wafer 11, a soft resin layer 15 is pressure-bonded on the surface as shown in FIG. 4E. The resin layer 15 has a glass transition temperature lower than the curing temperature of the thermosetting resin that is included in the insulation sheet 1 used for forming the wiring substrate.

Figure 4F:
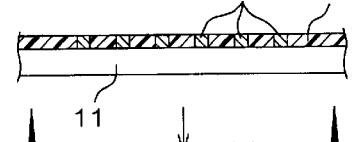
Figure 4G:
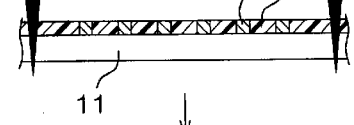

Further, as shown in FIG. 4F, the via posts 14 are exposed by polishing and removing the resin layer 15. Then the wafer 11 is diced into semiconductor chips, as shown in FIG. 4G, thereby to obtain semiconductor devices C shown in FIG. 4H that are to be incorporated.

Figure 4H:
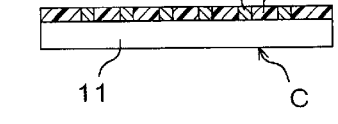
Figure 4B:
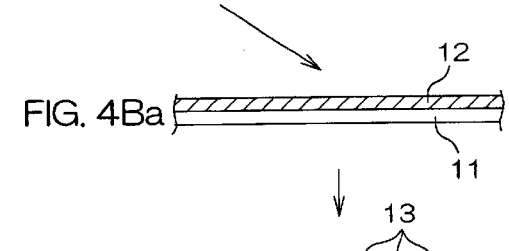
Figure 4C:
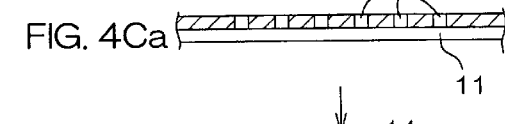
Figure 4D:
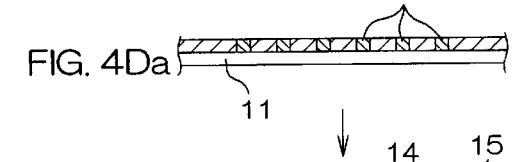
Figure 4E:
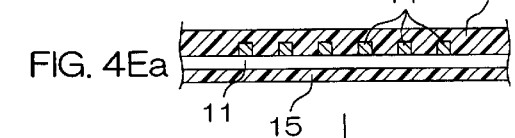
Figure 4F:
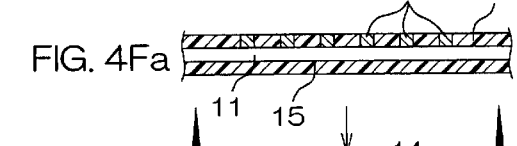
Figure 4G:
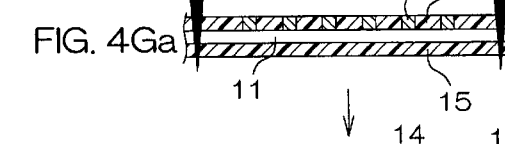
Figure 4H:
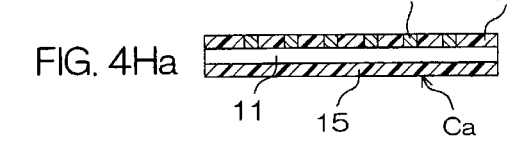

In case the semiconductor wafer 11 is thin and has insufficient strength, it is preferable to subject the wafer 11 of FIG. 4A to the steps of FIGS. 4B*a* to 4H*a*. Specifically, the resin layers 15 are provided on both sides of the wafer 11 (FIG. 4E*a*) after the steps of FIG. 4B*a* to 4D*a* that are similar to the steps of FIGS. 4B to 4D. Then the resin layer 15 on the via post 14 side is polished thereby to expose the via posts 14 (FIG. 4F*a*), followed by dicing of the wafer 11 (FIG. 4G*a*) to separate it into semiconductor chips Ca (FIG. 4H*a*).

Examples of the semiconductor chips Ca produced as described above include memory chips, MPU and system LSI. Devices of so-called flip-chip type with electrodes arranged in a matrix on one surface thereof are preferably produced by the process applied to the semiconductor chip Ca as described above. Chips having large areas such as memory chips are preferably incorporated in the wiring board.

FIGS. 5A to 5G are diagrams explaining another method of producing the semiconductor devices. First, as shown in FIG. 5A, the wafer 11 with semiconductor circuit formed thereon is prepared, while a soft resin layer 16 is made separately as shown in FIG. 5B. The resin layer 16 has a glass transition temperature lower than the curing temperature of the thermosetting resin included in the insulation sheet 1 that constitutes the wiring substrate. Via holes 17 are formed in the resin layer 16 to penetrate in the direction of thickness therethrough (FIG. 5C), while the via holes 17 are filled with the conductive paste by screen printing or sucking, thereby forming via hole conductors 18 for the connection of semiconductor devices (FIG. 5D).

The resin layer 16 is adhered onto the wafer 11 (FIG. 5E). After drying the resin layer 16 as required, the resin layer 16 and the wafer 11 are diced together in the size prescribed (FIG. 5F), thereby to separate into the semiconductor devices D to be incorporated (FIG. 5G).

In case the semiconductor wafer 11 is thin and has insufficient strength, it is preferable to subject the wafer 11 shown in FIG. 5A to the steps of FIGS. 5B*a* to 5G*a*. Specifically, the resin layer 16 is formed on one surface of the wafer 11 after the steps of FIG. 5B*a* to 5D*a* that are similar to the steps of FIG. 5B to 5D, while forming a similar resin layer 16 on the other surface of the wafer 11 (FIG. 5E*a*). Then the wafer 11 with the resin layer 16 formed on both sides thereof is diced (FIG. 5F*a*), to separate it into semiconductor chips Da (FIG. 5G*a*).

There is no limitation to the material of the resin layer 15, 16 as long as the glass transition point Tg thereof is lower than the curing temperature T1 of the thermosetting resin included in the insulation layer of the wiring substrate. For example, a thermosetting resin or a thermoplastic resin such as phenolic resin, epoxy resin, imide resin, phenylene-ether resin, bismaleimide triazine resin, acrylic resin, polypropylene resin and polyethylene resin may be used alone or in combination. It is particularly preferable to use a material having a glass transition temperature Tg lower than the curing temperature T1 by 30° C. or more.

The resin layer 15, 16 may be made of a composite material consisting of an organic resin and a filler. As the filler mixed with the organic resin, for example, inorganic compounds such as $SiO_2$, $Al_2O_3$, AlN and SiC are preferably used. Non-woven fabric or woven fabric made of such a material as glass or aramid resin impregnated with the resin described above may also be used. The organic resin and the filler are preferably mixed in proportions in a range from 25:75 to 95:5 by volume.

Among the materials described above, a mixture of thermosetting resin mainly based on epoxy resin and silica is most preferable in view of the adhesion with the silicon chip.

As the metal included in the conductive paste that fills in the via holes 17 to be connected with the electrodes of the semiconductor devices, tin (Sn), zinc (Zn), bismuth (Bi), silver (Ag), copper (Cu) or the like, or an alloy of these metals is preferably used.

Now a method of assembling the wiring board incorporating the electrical device of this embodiment will be described below with reference to FIGS. 6A to 6E.

Figure 6A:
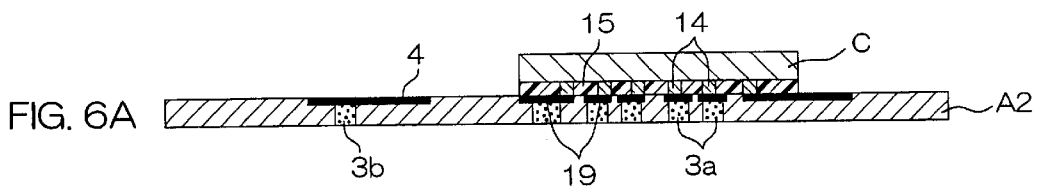
FIGS. 6A to 6E are sectional views for explaining a method for assembling the wiring board incorporating the electrical devices according to the embodiment described above.

First, as shown in FIG. 6A, the semiconductor devices C (or Ca, D or Da; the same applies to the description that follows) produced in the steps of FIGS. 4A to 4H (or FIG. 4A and FIGS. 4Ba to 4Ha) or the steps of FIGS. 5A to 5G (or FIG. 5A and FIGS. 5Ba to 5Ga) are placed on the surface of the wiring sheet A2 made in the steps shown in FIGS. 2A to 2D. At this time, the via posts 14 formed on the back surface of the semiconductor devices C are brought into contact with the pads 19 that are provided on the wiring sheet A2. In case the connection pads 19 are not formed on the surface of the via hole conductors 3a, the via posts 14 are put into contact with the exposed end faces of the via hole conductors 3a.

Figure 6B:
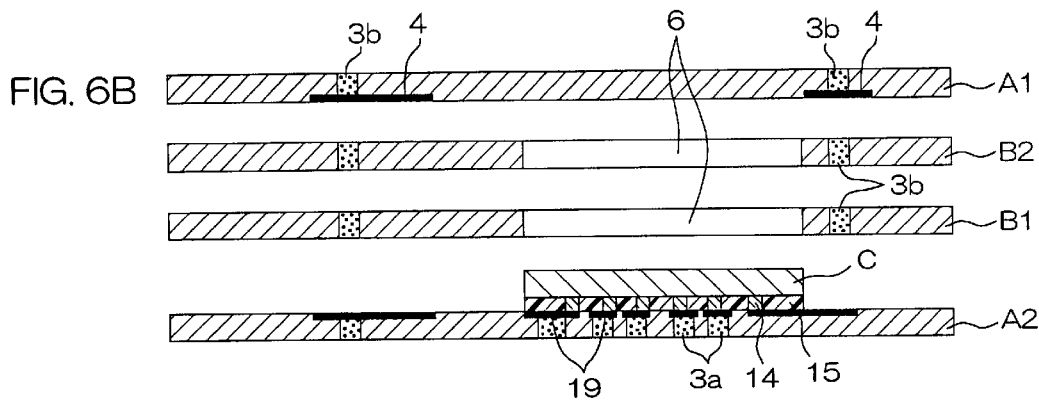
Figure 6C:
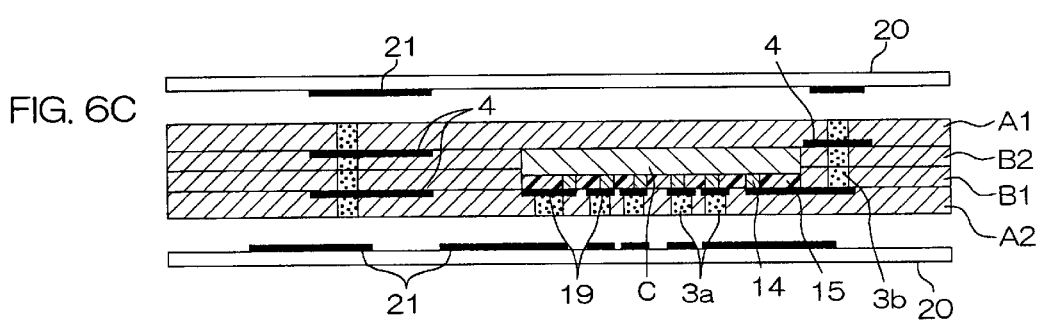

Then as shown in FIG. 6B, a wiring sheet A1 produced in the steps of FIGS. 1A to 1E and wiring sheets B1, B2 produced in the steps of FIGS. 3A to 3D having the cavity 6 for incorporating the semiconductor device formed therein are laminated on the front surface and/or the back surface of the wiring sheet A2 that has the semiconductor device C mounted thereon, so that the semiconductor device C is housed in the cavity 6.

Figure 6D:
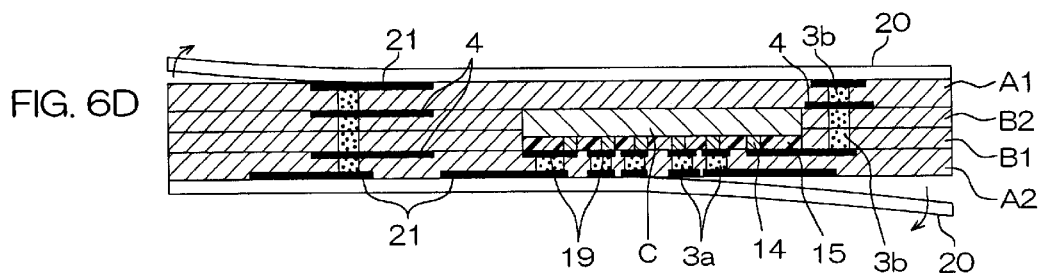

When it is necessary, a wiring circuit layer 21 formed on the surface of the transfer film 20 is pressed against the front surface or the back surface of the laminate formed as described above (FIG. 6C), then only the transfer film 20 is removed thereby to transfer the wiring circuit layer 21 onto the front surface or the back surface of the laminate (FIG. 6D).

Figure 6E:
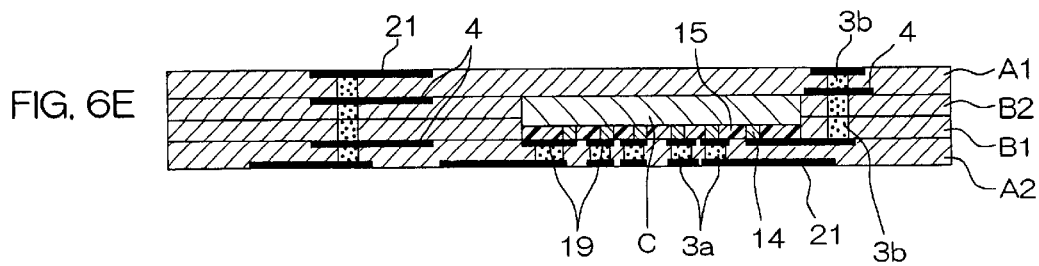

Then the laminate made as described above is heated to a temperature equal to or higher than the curing temperature T1 of the thermosetting resin included in the insulation sheet 1, thereby curing the laminate completely (FIG. 6E).

As the conductor included in the via posts 14 formed in the resin layer 15 (or 16) of the semiconductor devices C and/or the conductor included in the via hole conductors provided in the wiring board, a conductor containing low melting point metal such as a eutectic alloy solder that has a melting point T2 lower than the curing temperature T1 is preferably used. When fabricating the laminate, it is preferable to keep contact between the electrodes of the semiconductor device C and the via hole conductors 3a, between the via posts 14 and the pads 19, or between the via posts 14 and the via hole conductors 3a. This causes the low-melting point material to melt during the thermal curing thereby electrically connecting and fastening each contact portion, thus making it possible to carry out electrical connection and fastening of the semiconductor devices and thermal curing at the same time.

Where the pads 19 are provided, the connectivity between the electrodes of the semiconductor device C and the pads 19 via the via posts 14 can be improved if the conductor in the via posts 14 contains a low melting point metal.

Where the pads are not provided, on the other hand, the connectivity between the electrodes of the semiconductor device C and the via hole conductors 3a via the via posts 14 can be improved if the conductor in the via posts 14 and/or via hole conductors 3a contains a low melting point metal.

The resin layer 15 (or 16) having a glass transition temperature Tg lower than the curing temperature T1 of the thermosetting resin included in the insulation layer is formed at least on one side of the semiconductor device C facing the insulation layer. Consequently, the resin layer 15 (or 16) is in softened state at the thermal curing temperature T1. As a result, stress caused by the shrinkage of the insulation layer during thermal curing or other causes is absorbed by the softened resin layer 15 (or 16), thereby relieving the semiconductor device C from additional stress.

While the resin layer 15 (or 16) absorbs and mitigates the stress caused by the difference in thermal expansion coefficient between the wiring layer of the wiring board and the semiconductor device, thickness of the resin layer 15 (or 16) is preferably 0.1 mm or larger in order to have this function in full play.

According to this embodiment, as described above, the semiconductor device incorporated wiring board can be produced wherein the semiconductor device C is mounted in the closed cavity 6 enclosed inside the multi-layer wiring board and are electrically connected in the cavity 6 to the via hole conductors 3 of the wiring board and to the wiring circuit layer 4, as shown in FIG. 6E. Similar configuration is employed also when the semiconductor devices D produced in the steps shown in FIG. 5A to FIG. 5G are used.

Further, according to the production method of this embodiment, the curing step need not be repeated a plural times, unlike the conventional process. That is, soft-state insulation layers are laminated to prepare an electrical device incorporated laminate, followed by complete curing of the laminate. This results in a simple production process.

Figure 7:
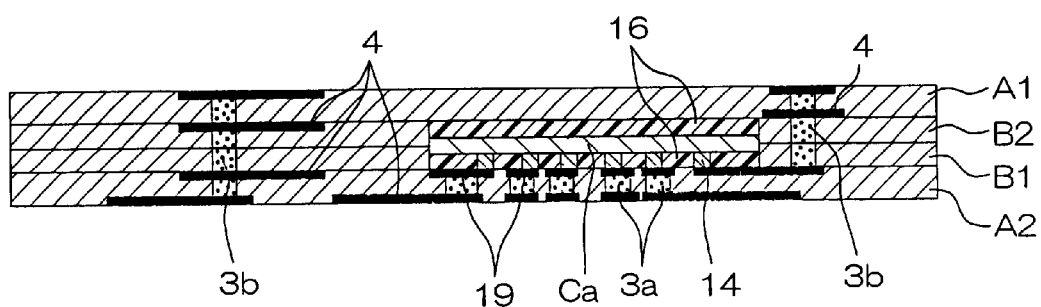
FIG. 7 is a schematic sectional view of the wiring board completed by using the semiconductor devices produced in the steps shown in FIG. 4A and FIGS. 4B$a$ to 4H$a$.

FIG. 7 is a schematic sectional view of the wiring substrate that is completed by using the semiconductor device D produced in the steps shown in FIG. 4A and FIG. 4Ba to FIG. 4Ha. Similar configuration is obtained also when using the semiconductor device Da produced in the steps shown in FIG. 5A and FIGS. 5Ba to 5Ga.

According to this embodiment, the method described above can be extended to produce wiring boards incorporating any types of electrical device. For example, a wiring board incorporating a plurality of electrical devices can be produced by forming a plurality of cavities either in the same layer or in different layers of the multi-layer wiring board, and housing the electrical devices in the cavities.

Before the thermosetting resin is cured, it is preferable for improving the reliability to apply a pressure of 5 kg/cm$^2$ in a temperature range of ±30° C. around the temperature where the molten resin shows the minimum viscosity, thereby to fluidize the resin and minimize the clearance between the electrical device C and the surrounding insulation layer.

Although the production method described above is for a case of housing the electrical device inside the board, the method can also be applied to such an application where the electrical device is incorporated in or mounted on the wiring board with the surface of the electrical device being exposed on one side of the wiring board.

Further, another electrical device can be mounted on the surface of the wiring board that incorporates an electrical device housed therein. In this case, surface mounting of the electronic device by means of a solder such as a solder paste can be carried out simultaneously with the thermal curing process.

Thus according to this embodiment, since not only a single electrical device but also a plurality of electrical devices can be mounted easily on the wiring board, such an electrical device incorporating wiring board can be provided that reduces the size of the wiring board and increases the packaging density of the electrical devices. Also because the production method of this embodiment makes it possible to connect the electrical device to the wiring board and produce the multi-layer wiring board at the same time, the production process can be simplified, yield of production can be improved and the cost can be reduced.

The electrical devices may include capacitor, resistor, filter and oscillator as well as semiconductor device, that are preferably those having heat-resisting temperature higher than the curing temperature T1.

Although the embodiment described above is an example of applying a prepreg for the insulation sheet 1, an insulation sheet other than prepreg may also be used. Specifically, such a process may be employed as a soft (in the B stage) insulation sheet that includes a thermosetting resin having curing temperature T1 is made and via holes are formed to penetrate through the thickness of the sheet.

On production of the insulation sheet, the thermosetting resin or a mixture consisting of the thermosetting resin and a filler is sufficiently mixed by such means as a kneading machine or three-roll mill. The insulation sheet can be made by forming the mixture into sheet shape by rolling, extrusion, injection, doctor blade, or other technique. The insulation sheet may also be cured to intermediate hardness by applying heat treatment at a temperature slightly lower than the curing temperature, as required.

EXAMPLE 1

First step

Via posts were formed by covering a silicon wafer having a semiconductor circuit formed thereon with a photoresist film, forming via holes through exposure to light and development, and plating with copper inside the via holes.

On the other hand, resins in the state of varnish and a powder were mixed in proportions of 40% by volume of epoxy resin (glass transition point Tg=100 to 180° C.) or 40% by volume of polyimide resin (glass transition point Tg=250°C.) and 60% by volume of silica powder. The mixture was formed into an insulation sheet having thickness of 50 μm by the doctor blade process. After contact-bonding the insulation sheet that has been formed onto the via post forming surface of the silicon wafer described above without gap, the insulation sheet was polished to expose all the via posts. Then after inspecting the semiconductor circuit, the wafer was separated into individual semiconductor chips by dicing, thereby making the semiconductor devices to be incorporated (heat-resisting temperature of the devices was 250° C.

Second step

Such a prepreg was prepared that comprised 55% by volume of A-PPE (thermosetting polyphenylene ether) resin (curing temperature 200° C.) and 45% by volume of woven glass fabric. Via holes having diameter of 100 μm were formed in the prepreg sheet by carbon dioxide gas laser, and the via holes were filled with a conductive paste that included copper powder having mean particle diameter of 5 μm with the surface being plated with silver. A cavity measuring 10.05 mm×10.05 mm, slightly larger than the semiconductor device to be housed therein was formed in part of the prepreg sheet by trepanning with carbon dioxide gas laser.

PPE (polyphenylene-ether) resin in the state of varnish and a silica powder were mixed in the proportion of 50% by volume for silica powder. The mixture was formed into an insulation sheet having thickness of 150 μm by the doctor blade process. A plurality of via holes of 0.1 mm in diameter were formed in the insulation sheet a by punching, and the via holes were filled with a copper paste including copper powder of mean particle diameter of 5 μm with the surface being plated with silver, thereby forming the via hole conductors. Of the via holes, those to be connected to the via posts of the semiconductor device were filled with a paste containing copper powder and Sn-Pb eutectic solder powder in the proportion of 50% by volume.

Third step

After applying an adhesive on the surface of a transfer sheet made of polyethylene terephthalate (PET) resin, a copper foil having thickness of 12 μm and surface roughness of 0.8 μm was bonded over the entire surface. After applying a photoresist (dry film) and subjecting it to exposure and development, unnecessary portions of the copper foil were removed by etching in a ferric chloride solution bath thereby to form the circuit pattern. The wiring circuit layer thus produced is made in a fine pattern having wire width of 20 μm and space between wires 20 μm.

Fourth step

The transfer sheet was bonded to the insulation sheet a produced in the second step with the wiring circuit layer side of the transfer sheet facing the surface of the insulation sheet a, with a pressure of 30 kg/cm². Then the transfer sheet was peeled off, with the wiring circuit layer being transferred onto the insulation sheet a. Pads 19 were not formed in this Example.

Fifth step

The semiconductor device to be incorporated that was made in the first step was placed on the surface of the insulation sheet a whereon the via hole conductors and the wiring circuit layer were formed. After making positioning so that the via posts formed on the back side of the device and the exposed end faces of the via hole conductors make contact with each other, both members were temporarily fastened with an organic adhesive.

Sixth step

A cavity measuring 10.05 mm×10.05 mm was formed by punching in the insulation sheet b whereon the via hole conductors or the wiring circuit layer was formed, similarly to the case of the insulation sheet a. Such a number of the insulation sheets b were laminated one on another that corresponded to the thickness of the semiconductor device. Lastly, an insulation sheet c having no cavity was placed on the laminate and bonded with a pressure of 20 kg/cm².

Seventh step

The laminate was heated at 200° C. for one hour to cure completely, thereby making the multi-layer wiring board. As the resin was fluidized by heating, the cavity in the insulation sheet contracted so that the insulation layer and the chip made contact with each other, almost eliminating the clearance between the chip and the insulation layer.

The multi-layer wiring board thus obtained was subjected to 1000 cycles of thermal cycle test wherein the temperature was changed between −55° C. and 125° C. After the test, resistance of connection between the semiconductor device and the multi-layer wiring board was measured. Those experiencing variations in the resistance within 10% of the initial resistance were passed. Ratio of passed samples is shown in Table 1.

Solder reflow test was conducted by placing the multi-layer wiring board at 260° C. for 30 seconds, and measuring connection resistance thereafter. Those experiencing the resistance variation ratio within 10% with respect to the initial resistance were passed. Ratio of passed samples is shown in Table 1.

TABLE 1

| Sample No. | Resin layer Material | Glass transition temperature (° C.) | Thickness (mm) | Thermal cycle test (number of passed samples/ number of all samples) | Solder reflow test (number of passed samples/ number of all samples) | Remarks |
|---|---|---|---|---|---|---|
| *1 | None | None | — | 0/20 | 0/20 | Breakage of chip occurred 5/20 |
| *2 | Polyimide | 250 | 0.1 | 1/20 | 0/20 | |
| 3 | Thermosetting epoxy | 180 | 0.5 | 15/20 | 17/20 | |
| 4 | Thermoplastic epoxy | 160 | 0.4 | 20/20 | 20/20 | |
| 5 | Thermoplastic epoxy | 140 | 0.5 | 20/20 | 20/20 | |
| 6 | Thermoplastic epoxy | 120 | 0.3 | 20/20 | 20/20 | |
| 7 | Thermoplastic epoxy | 100 | 0.2 | 20/20 | 20/20 | |
| 8 | Thermosetting epoxy | 130 | 0.2 | 20/20 | 20/20 | |

As shown in Table 1, no samples belonging to sample No. 1 where resin layer was not formed passed the thermal cycle test or the solder reflow test. Moreover, some of the semiconductor devices in these samples were broken. In the sample No. 2 where the resin layer was formed but the glass transition temperature of the resin layer was higher than the thermal curing temperature, effect of forming the resin layer was not achieved.

On the semiconductor device incorporating wiring board of the present invention having the specified resin layer formed thereon, the circuit layer and portions near the via hole conductors in the cross section were checked. Satisfactory state of continuity was confirmed between the semiconductor devices and the multi-layer wiring board. Continuity test of the wiring showed no breakage of the wiring and the semiconductor functioned without any problem.

EXAMPLE 2

First step

50% by volume of PPE (polyphenylene-ether) resin (curing temperature T1=200° C.) in the state of varnish and 50% by volume of silica powder were mixed. The mixture was formed into an insulation sheet a 75 µm thick by the doctor blade process. A plurality of via holes 0.1 mm in diameter were formed in the insulation sheet a by punching. The via holes were filled with a conductive paste, thereby forming the via hole conductors. The conductive paste was made by mixing metal component consisting of 50% by volume of copper powder having mean particle diameter of 5 µm with the surface being plated with silver, 50% by volume of Sn-Pb eutectic solder powder having mean particle size of 3 µm (melting point T2=183° C.) as a low-melting point metal, and 5% by volume of triallyl isocyanurate.

Second step

With an adhesive applied to the surface of a transfer sheet made of polyethylene terephthalate (PET) resin, a copper foil having thickness of 12 µm and surface roughness of 0.8 µm was bonded over the entire surface. After applying a photoresist (dry film) and subjecting it to exposure and development, unnecessary portions of the copper foil were removed by etching in a ferric chloride solution bath thereby to form the wiring circuit layer. The wiring circuit layer thus produced was made in a fine pattern having wire width of 20 µm and space between wires 20 µm.

Third step

The transfer sheet was bonded to the insulation sheet a produced in the first step with the wiring circuit layer side of the transfer sheet facing the surface of the insulation sheet, with a pressure of 50 kg/cm². Then the transfer sheet was peeled off, with the circuit pattern being transferred onto the insulation sheet a. Pads were formed on portions of the insulation sheet a that were to be connected to the electrodes of the semiconductor device.

Fourth step

A thermoplastic epoxy resin sheet was prepared, and via holes were formed therein at positions that are to be brought into contact with the electrodes of the semiconductor device. The via holes were then filled with a conductive paste of the same kind as used in the first step, thereby forming via hole conductors. The resultant resin sheet was bonded to one surface of a wafer on which Si series semiconductor devices (LSIs) were formed. Thereafter, the resulting laminate was diced into semiconductor devices which were to be incorporated.

Fifth step

An Si series semiconductor device (heat-resisting temperature 250° C.) produced in the Fourth step was placed on the surface of the insulation sheet a whereon the via hole conductors and the wiring circuit layer was formed. After making alignment so that the via bole conductors formed on the back side of the device and the pads make contact with each other, the device was temporarily fastened with an adhesive.

Sixth step

An opening or cavity slightly larger than the electrical device (semiconductor device) was formed by punching in the insulation sheet b whereon the via hole conductors or the wiring circuit layer was formed, similarly to the case of the insulation sheet a. Such a number of the insulation sheets b were laminated one on another that corresponded to the thickness of the electrical device. Lastly, an insulation sheet c having no opening or cavity was placed on the laminate and bonded with a pressure of 20 kg/cm².

Seventh step

The laminate was heated at 200° C. for one hour to cure completely, thereby making the multi-layer wiring board. As the resin was fluidized by heating, the opening in the insulation sheet contracted so that the insulation layer and the device made contact with each other, thereby almost eliminating the clearance between the device and the insulation layer.

The multi-layer wiring board thus obtained was inspected by observing the circuit layer and portions near the via hole conductors in the cross section. Satisfactory state of continuity was confirmed between the semiconductor devices and via hole conductors due to the low-melting point metal included in the via hole conductors that melted. Continuity test of the wiring showed no breakage of the wiring and the semiconductor functioned without any problem. After being left to stand in high temperature, high humidity atmosphere of 85% in humidity and 85° C. in temperature for 100 hours, the multi-layer wiring board showed no visible variation at all.

While the preferred embodiments of the present invention have been described in detail above, these embodiments should be considered to be mere specific examples used for clarifying the technical features of the present invention, not as restricting the present invention, of which spirit and scope are restricted only by the appended claims.

The present application corresponds to Japanese Patent Application No. 11-218056 filed to the Japanese Patent Office on Jul. 30, 1999 and Japanese Patent Application No. 11-24425 filed to the Japanese Patent Office on Feb. 1, 1999, the entire disclosures of which are incorporated herein by reference.

What is claimed is:

1. An electrical device mounting wiring board, comprising:

a wiring board including an insulation substrate made by laminating a plurality of insulation layers that contain a thermosetting resin, wiring circuit layers formed on the surface of and inside of the insulation substrate and via hole conductors;

an electrical device, that has electrodes electrically connected to the via hole conductors or the wiring circuit layer and is incorporated inside of the wiring substrate; and a resin layer having a glass transition temperature lower than a curing temperature of the thermosetting resin and is formed between at least one of top and bottom surfaces of the electrical device and the insulation layer.

2. The electrical device mounting wiring board according to claim 1, wherein the resin layer includes a composite material consisting of a thermosetting resin having a glass transition temperature lower than the curing temperature of the thermosetting resin and an inorganic compound.

3. The electrical device mounting wiring board according to claim 2, wherein the thermosetting resin having a glass transition temperature lower than the curing temperature of the thermosetting resin is an epoxy series resin and the inorganic compound is silicon oxide.

4. The electrical device mounting wiring board according to claim 1, wherein a conductive path for the electrical connection between the electrodes of the electrical device and the via hole conductors or the wiring circuit layer is formed in the resin layer.

5. The electrical device mounting wiring board according to claim 4, wherein the conductive path includes a low-melting point metal having melting point equal to or lower than the curing temperature of the thermosetting resin.

6. The electrical device mounting wiring board according to claim 1, wherein the via hole conductors connected to the electrodes include a low-melting point metal having melting point equal to or lower than the curing temperature of the thermosetting resin, while the via hole conductors and the electrodes of the electrical device are electrically connected and fastened by the low-melting point metal.

7. The electrical device mounting wiring board according to claim 1, further comprising connection pads, that include a low-melting point metal having melting point equal to or lower than the curing temperature of the thermosetting resin, and are provided between the electrodes and the via hole conductors connected to the electrodes.

8. The electrical device mounting wiring board according to claim 1, wherein the electrical device is mounted in a closed cavity formed inside the wiring substrate.

9. The electrical device mounting wiring board according to claim 1, wherein the electrical device is a semiconductor device.

10. The electrical device mounting wiring board according to claim 9, wherein the electrodes are formed in a matrix arrangement on a principal surface of the semiconductor device.

* * * * *